(12) United States Patent  
Kodera et al.

(10) Patent No.: US 8,928,397 B2
(45) Date of Patent: Jan. 6, 2015

(54) SEMICONDUCTOR DEVICE AND VOLTAGE DIVIDER

(75) Inventors: Kazushi Kodera, Kasugai (JP); Yoshiharu Kato, Kasugai (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 13/564,357

(22) Filed: Aug. 1, 2012

(65) Prior Publication Data
US 2013/0038385 A1 Feb. 14, 2013

(30) Foreign Application Priority Data

Aug. 8, 2011 (JP) .................................. 2011-173233

(51) Int. Cl.
*G05F 1/10* (2006.01)
*G05F 3/02* (2006.01)

(52) U.S. Cl.
USPC ............................ 327/538; 327/530; 327/308

(58) Field of Classification Search
USPC ........................................ 327/530, 538, 308
See application file for complete search history.

(56) References Cited

U.S. PATENT DOCUMENTS

| | | | | |
|---|---|---|---|---|
| 5,796,296 | A * | 8/1998 | Krzentz | 327/545 |
| 6,259,150 | B1 * | 7/2001 | Mori | 257/536 |
| 2009/0153237 | A1 * | 6/2009 | Tanzawa | 327/545 |

FOREIGN PATENT DOCUMENTS

| | | | |
|---|---|---|---|
| JP | 6-162825 A | | 6/1994 |
| JP | 8-125460 A | | 5/1996 |
| JP | 11-103016 A | | 4/1999 |
| JP | 11103015 A | * | 4/1999 |
| JP | 2001-168651 A | | 6/2001 |
| JP | 2010-109233 A | | 5/2010 |

OTHER PUBLICATIONS

English-language abstract of Japanese Patent Application Publication No. 6-163825 A; 2 pages.
English-language abstract of Japanese Patent Application Publication No. 8-125460 A; 2 pages.
English-language abstract of Japanese Patent Application Publication No. 11-103016 A; 2 pages.

* cited by examiner

*Primary Examiner* — Quan Tra
(74) *Attorney, Agent, or Firm* — Sterne, Kessler, Goldstein & Fox P.L.L.C.

(57) ABSTRACT

A semiconductor device includes first and second resistors. The first resistor is formed in a first substrate region and coupled between a first node and an output node. The second resistor is formed in a second substrate region and coupled between the output node and a second node. The first substrate region is coupled to the first node which has a first voltage. The second node has a second voltage. The second substrate region is coupled to a voltage dividing node that is set in the first resistor.

18 Claims, 12 Drawing Sheets

SEMICONDUCTOR DEVICE AND VOLTAGE DIVIDER

CROSS-REFERENCE TO RELATED APPLICATIONS

This application is based upon and claims the benefit of priority from prior Japanese Patent Application No. 2011-173233, filed on Aug. 8, 2011, the entire contents of which are incorporated herein by reference.

FIELD

The embodiments discussed herein are related to a semiconductor device and a voltage divider.

BACKGROUND

A circuit (e.g., analog circuit) formed in a semiconductor device (semiconductor chip) includes a resistor. A resistor formed on a chip is a diffused resistor or a polysilicon resistor. A diffused resistor is a diffusion layer formed in a well (e.g., epitaxial layer). A polysilicon resistor is a polysilicon film formed on an insulation film (e.g., oxidized film), which is applied to a substrate region (e.g., epitaxial layer).

A resistor formed on a chip has an electrical resistance that changes in accordance with the potential difference between the resistor and a substrate region such as a well. Thus, the connection of one end of a polysilicon resistor to the substrate region or the like suppresses changes in the electrical resistance caused by such potential differences (refer to, for example, Japanese Laid-Open Patent Publication Nos. 2001-168651 and 2010-109233).

When forming a voltage dividing resistor with a diffused resistor or a polysilicon resistor, the voltage applied across the two terminals of a resistor would differ between resistors. Thus, when resistors have the same shape, the difference in the potential at the two terminals and the potential at the substrate region may differ between resistors. A diffused resistor and a polysilicon resistor change the extent to which their depletion layers spread in accordance with the difference of the potential at the substrate region and the potential at the terminals. Accordingly, in a circuit that series-connects two resistors, which are formed to have the same electrical resistance, and outputs a divisional voltage from a node between the two resistors, there may be a difference between the amount of change in the electrical resistance at the high potential side resistor and the amount of change in the electrical resistance at the low potential side resistance. Accordingly, even when two resistors are formed to have the same size and shape, changes in the electrical resistance ratio of the two resistors obstruct the generation of the desired divisional voltage.

SUMMARY

According to an aspect of the embodiments, a semiconductor device including a first resistor and a second resistor. The first resistor is formed in a first substrate region and coupled between a first node and an output node. The second resistor is formed in a second substrate region and coupled between the output node and a second node. The first substrate region is coupled to the first node which has a first voltage. The second node has a second voltage. The second substrate region is coupled to a voltage dividing node that is set in the first resistor.

The object and advantages of the invention will be realized and attained by means of the elements and combinations of particularly pointed out in the claims.

It is to be understood that both the foregoing general description and the following detailed description are exemplary and explanatory and are not restrictive of the invention.

BRIEF DESCRIPTION OF THE DRAWINGS

The embodiment, together with objects and advantages thereof, may best be understood by reference to the following description of the presently preferred embodiments together with the accompanying drawings in which.

DESCRIPTION OF EMBODIMENTS

First Embodiment

A first embodiment will now be described with reference to FIGS. 1 to 6.

Figure 1:
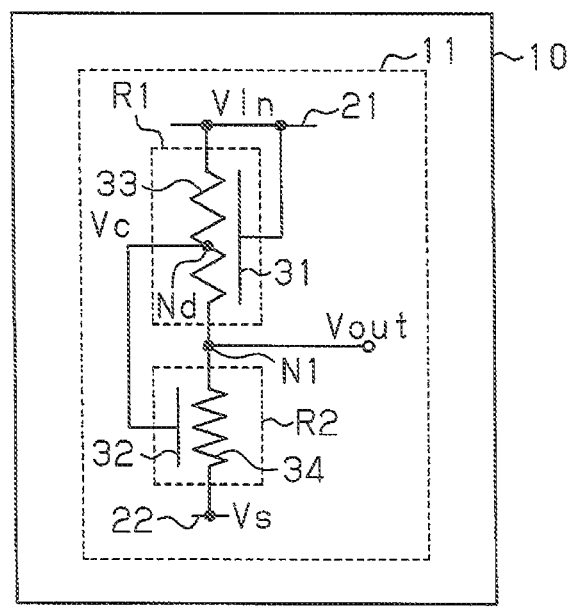
FIG. 1 is a circuit diagram of a voltage divider in a first embodiment.

FIG. 1 illustrates a semiconductor device 10 including a voltage divider 11. The voltage divider 11 is coupled between a wire 21, which supplies an input voltage Vin, and a wire 22, which supplies a reference voltage (e.g., ground voltage (0 V)) that is lower than the input voltage V1, to generate the output voltage Vout between the input voltage Vin and the reference voltage Vs.

The voltage divider 11 includes two series-connected resistors R1 and R2. The first resistor R1 is coupled between the wire 21, which supplies the input voltage Vin, and an output node N1. The second resistor R2 is coupled between the wire 22, which supplies the reference voltage Vs, and the output node N1. The first resistor R1 has an electrical resistance that is greater than that of the second resistor R2. The voltage divider 11 generates a divisional voltage between the input voltage Vin and the reference voltage Vs at the output node N1 in accordance with the ratio (electrical resistance ratio) of the electrical resistance of the first resistor R1 and the electrical resistance of the second resistor R2. The voltage divider 11 outputs the voltage at the output node N1 (output voltage Vout).

The first resistor R1 and second resistor R1 are, for example, diffused resistors.

Figure 2:
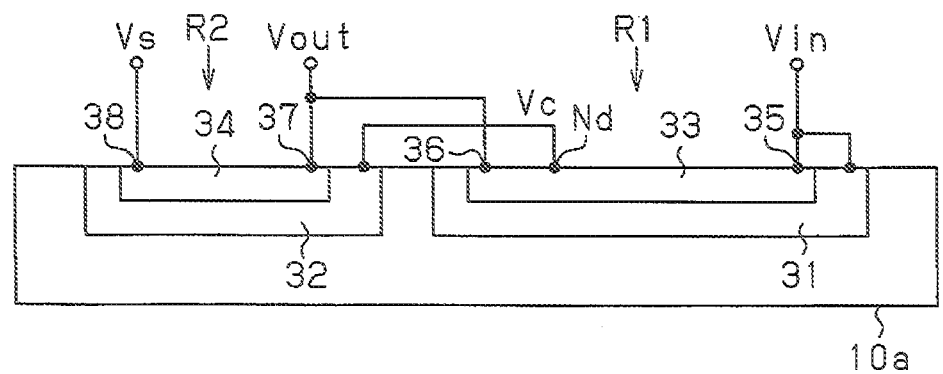
FIG. 2 is a schematic cross-sectional view of a semiconductor device.

Referring to FIG. 2, a P-type semiconductor substrate 10a includes N-type well regions 31 and 32. A P-type diffusion region 33 is formed in the first well region 31. In the same manner, a P-type diffusion region 34 is formed in the second well region 32. The first resistor R1 includes the N-type well region 31 and the P-type diffusion region 33, which is formed in the well region 31. In the same manner, the second resistor R2 includes the N-type well region 32 and the P-type diffusion region 34, which is formed in the well region 32. The well region 31 is one example of a first substrate region, and the well region 32 is one example of a second substrate region. The diffusion region 33 is one example of a first resistor element, and the diffusion region 34 is one example of a second resistor element.

The first well region 31 and the second we region 32 are formed by doping impurities (i.e., donors), such as phosphorus (P), arsenic (As), and antimony (Sb), to the semiconductor substrate 10a. The first diffusion region 33 and the second diffusion region 34 are formed by doping impurities (acceptors), such as boron (B) and aluminum (Al), to the well regions 31 and 32.

The first diffusion region 33 includes a first terminal 35 (right terminal as viewed in FIG. 2) supplied with the input voltage Vin. Further, the first diffusion region 33 includes a second terminal 36 coupled to a first terminal 37 of the second diffusion region 34 by a low resistance wire. The second diffusion region 34 includes a second terminal 38 supplied with the reference voltage Vs.

The first well region 31 is supplied with the input voltage Vin. The second well region 32 is coupled to a voltage dividing node Nd that is set in the first diffusion region 33, by a low resistance wire. Accordingly, the second well region 32 is supplied with a divisional voltage of the voltages at the first terminal 35 and the second terminal 36 of the first diffusion region 33 in accordance with the location of the set voltage dividing node Nd.

The first diffusion region 33 and the second diffusion region 34 each function as a resistor element. The first diffusion region 33 and the second diffusion region 34 are connected in series. The first terminal 35 of the first diffusion region 33 is supplied with the input voltage Vin, and the second terminal 38 of the second diffusion region 34 is supplied with the reference voltage Vs. Accordingly, the second well region 32 is supplied with a voltage (divisional voltage) between the input voltage V1 and the reference voltage Vs in accordance with location of the set voltage dividing node Nd. The terminals 35 to 38 in the diffusion regions 33 and 34, connection points supplied with a bias voltage in the well regions 31 and 32, and the voltage dividing node Nd may be contacts, such as vias or plugs connected to a wire, or portions connected to contacts.

The location of the voltage dividing node Nd in the first diffusion region 33 is set where a medial voltage between the input voltage Vin and the reference voltage Vs is set. For example, when the reference voltage Vs is the ground potential (0 V), the voltage dividing node Nd is set at a location where a voltage that is one-half of the input voltage Vin (Vin/2) is generated. The medial voltage Vc is supplied to the well region 32 of the second resistor R2. Accordingly, the second resistor R2 has an electrical resistance that changes with a changing rate in accordance with the voltage at the high potential side terminal 37, namely, the output voltage Vout, the voltage Vs at the low potential side terminal 38, and the medial voltage Vc supplied to the well region 32. The first resistor R1 has an electrical resistance that changes with a changing rate in accordance with the voltage at the high potential side terminal 35, namely, the input voltage Vin, the voltage Vs at the low potential side terminal 36, namely, the output voltage Vout, and the voltage supplied to the well region 32, namely, the input voltage Vin.

Referring to FIG. 2, the location of the voltage dividing node Nd in the layout of the semiconductor device 10 is set so that the electrical resistance between the voltage dividing node Nd and the high potential side terminal 35, which is supplied with the input voltage Vin, is equal to the electrical resistance between the voltage dividing node Nd and the low potential side terminal 38, which is supplied with the voltage Vs. That is, the point at where a resistor between the terminal 35 and the terminal 38 is divided into two resistors having equal electrical resistances is set as the voltage dividing node Nd.

In this manner, by supplying the medial voltage Vc to the well region 32 of the second resistor R2, the changing rate of the electrical resistance of the first resistor R1 becomes substantially equal to the changing rate of the electrical resistance of the second resistor R2. This phenomenon was verified in the following manner. Under the assumption that a depletion layer causes changes in a resistor, the volume of the depletion layer was calculated using a simple model, and the results were as expected. The actual results conform to the theoretical calculations. In other words, the voltage dividing node in the first resistor R1 is set so that the depletion layer (volume) formed by the first resistor R1 is equal to the depletion layer (volume) formed by the second resistor R2.

Figure 4:
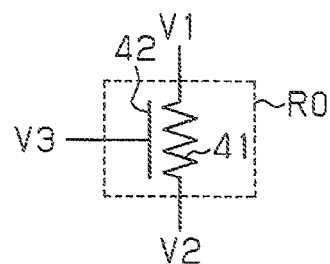
FIG. 4 is a circuit diagram of a resistor element.
Figure 5:
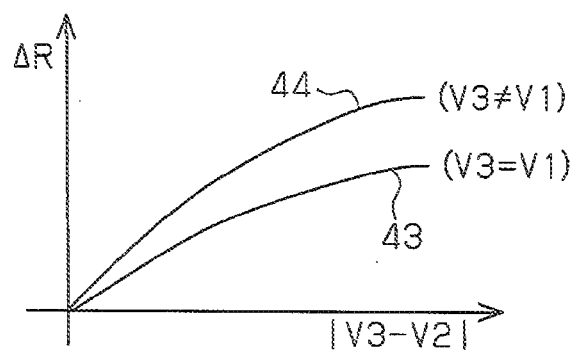
FIG. 5 is a graph illustrating the characteristics of the resistor elements of FIG. 4.

Referring to FIG. 4, V1 and V2 denote voltages at two ends of a diffusion region 41, which functions as a resistor element, in a resistor R0. The first voltage V1 is higher than the second voltage V2. Further, V3 denotes a voltage (well voltage) of a well region 42 in the resistor R0. When the well voltage V3 is equal to the first voltage V1 (V3=V1) in the resistor R0, a changing rate $\Delta R$ of the electrical resistance in the diffusion region 41 relative to an absolute value of the difference $\Delta V$ between the well voltage V3 and the low potential side second voltage V2 (|V3-V2|) is expressed by curve 43 in FIG. 5. In contrast, when the well voltage V3 differs from the first voltage V1 (V3≠V1), the changing rate $\Delta R$ of the electrical resistance in the diffusion region 41 relative to the voltage difference $\Delta V$ is expressed by curve 44 in FIG. 5.

Figure 3A:
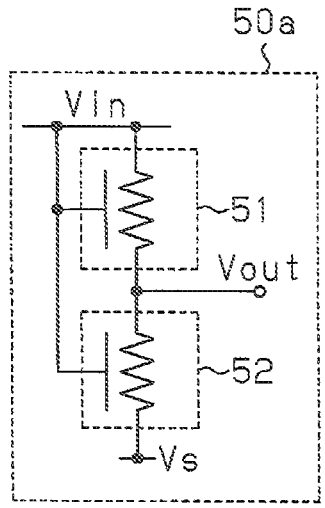
FIGS. 3A and 3B are circuit diagrams of voltage dividers in comparative examples.

A voltage divider 50a of the comparative example illustrated in FIG. 3A includes two series-connected resistors 51 and 52 having equal electrical resistances. Well regions of the two resistors 51 and 52 are supplied with the input voltage Vin, which is supplied to a high potential side terminal. Accordingly, the well region of the resistor 52 is supplied with the input voltage Vin that is higher than the voltage Vout at the high potential side terminal. The voltage difference between the voltage Vout at the low potential side terminal of the resistor 51 and the input voltage Vin supplied to the well region differs from the voltage difference between the voltage Vs at the resistor 52 and the well voltage (Vin). Thus, the changing rate $\Delta R$ of the electrical resistance differs between the two resistors 51 and 52.

Figure 3B:
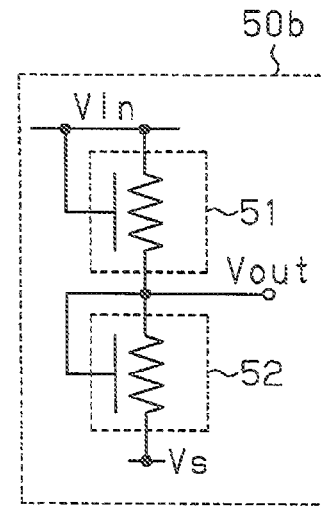

A voltage divider 50b of the comparative example illustrated in FIG. 3B includes two resistors 51 and 52 having equal electrical resistances. A well region of each of the resistors 51 and 52 is coupled to a corresponding high potential side terminal. Thus, the potential difference between terminals in the high potential side first resistor 51 is equal to the potential difference between terminals in the low potential side second resistor 52. As a result, the changing rate of the electrical resistance in the first resistor 51 is equal to the changing rate of the electrical resistance in the second resistor 52. However, the voltage divider 50b of FIG. 3B is effective only when the electrical resistance of the high potential side first resistor 51 is equal to the electrical resistance of the low potential side of the low potential side second resistor 52, that is, when dividing the input voltage Vin to ½. With respect to the output terminal, when the high potential side electrical resistance differs from the low potential side electrical resistance, the changing rate of the electrical resistance differs between resistors in the voltage divider 50b of FIG. 3B.

The first resistor R1 and the second resistor R2 may be semiconductor thin films.

Figure 6:
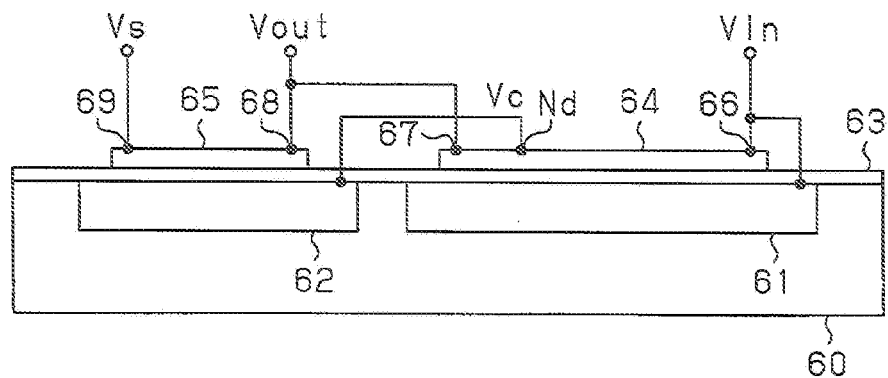
FIG. 6 is a schematic cross-sectional view of a semiconductor device.

Referring to FIG. 6, a P-type semiconductor substrate 60 includes two N-type well regions 61 and 62 (substrate regions). An insulation film 63 is formed on the substrate 60. The insulation film 63 is, for example, a silicon oxide film. A semiconductor thin film 64, which corresponds to the first well region 61, and a semiconductor thin film 65, which corresponds to the second well region 62, are formed on the insulation film 63. The semiconductor thin films 64 and 65 are, for example, polysilicon films or polysilicon films to which impurities are doped. The semiconductor thin films 64 and 65 are examples of resistor elements.

The semiconductor thin film 64 includes a first terminal 66 (right terminal as viewed in FIG. 6), which is supplied with the input voltage Vin, and a second terminals 67, which is coupled by a low resistance wire to a first terminal 68 of the second semiconductor thin film 65. The second semiconductor thin film 65 includes a second terminal 69 supplied with the reference voltage Vs.

The first well region 61 corresponding to the first semiconductor thin film 64 is supplied with the input voltage Vin. The second well region 62 corresponding to the second semiconductor thin film 65 is coupled by a low resistance wire to a voltage dividing node Nd that is set in the first semiconductor thin film 64. Accordingly, the bias voltage supplied to the second well region 62 is a medial voltage Vc of the high potential side input voltage Vin and the low potential side reference voltage Vs ((Vin+Vs)/2).

The first embodiment has the advantages described below.

(1) The voltage divider 11 includes the two series-connected resistors R1 and R2. The first resistor R1 is coupled to the wire 21, which supplies the input voltage Vin, and the output node N1. The second resistor R2 is coupled between the wire 22, which supplies the reference voltage Vs, and the output node N1. The first resistor R1 includes the N-type well region 31 (substrate region), which is formed in the P-type semiconductor substrate 10a, and the P-type diffusion region 33, which is formed in the well region 31. The second resistor R2 includes the N-type well region 32, which is formed in the P-type semiconductor substrate 10a, and the P-type diffusion region 34, which is formed in the well region 32. The first well region 31 is supplied with the input voltage Vin. The second well region 32 is coupled to the voltage dividing node Nd that is set in the first diffusion region 33.

The first resistor R1 has an electrical resistance that changes at a changing rate that is in accordance with the input voltage Vin, the output voltage Vout, and the input voltage Vin supplied to the well region 31. The second resistor R2 has an electrical resistance that changes at a changing rate that is in accordance with the output voltage Vout, the reference voltage Vs, and the medial voltage Vc at the voltage dividing node Nd. The difference between the changing rate of the electrical resistance in the first resistor R1 and the changing rate of the electrical resistance in the second resistor R2 changes in accordance with the medial voltage Vc. Accordingly, the medial voltage Vc may be set to decrease the difference between the changing rate of the electrical resistance in the first resistor R1 and the changing rate of the electrical resistance in the second resistor R2.

(2) The voltage dividing node Nd is set so that the electrical resistance between the voltage dividing node Nd and the terminal 35, which is supplied with the high potential side voltage (Vin), becomes equal to the electrical resistance between the voltage dividing node Nd and the terminal 38, which is supplied with the voltage Vs. The bias voltage supplied to the second well region 62 becomes the medial voltage Vc ((Vin+Vs)/2) of the high potential side input voltage Vin and the low potential side reference voltage Vs. As a result, the changing rate of the electrical resistance of the first resistor R1 may be substantially equalized with the changing rate of the electrical resistance of the second resistor R2.

Second Embodiment

Figure 8:
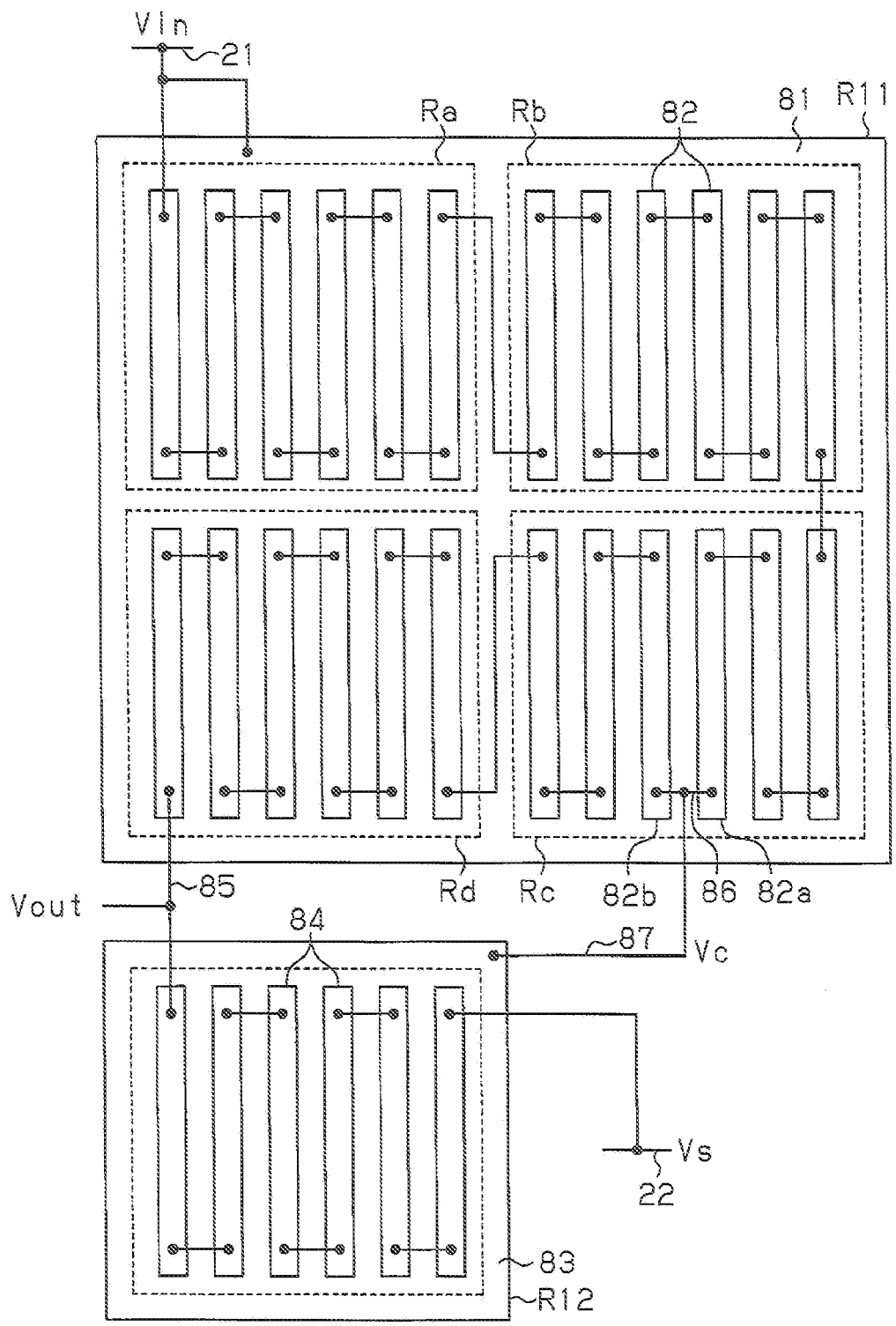
FIG. 8 is a schematic layout diagram of a voltage divider.
Figure 9:
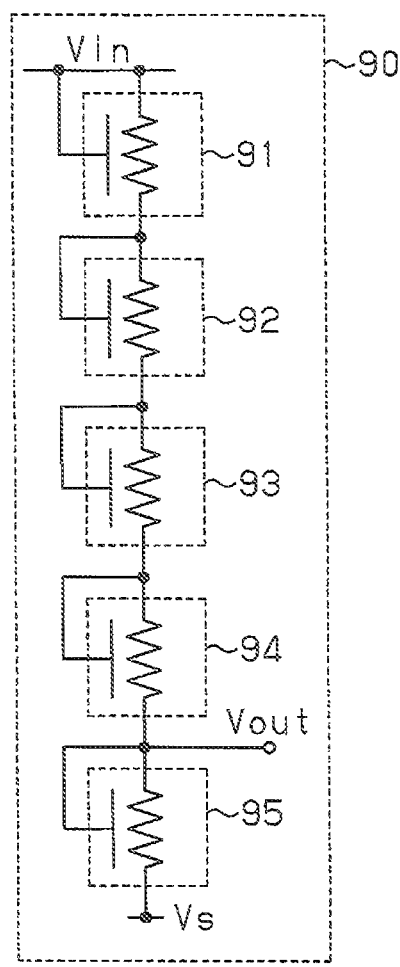
FIG. 9 is a circuit diagram of a voltage divider in a comparative example.

A second embodiment will now be described with reference to FIGS. 7 to 9.

Like or same reference numerals are given to those components that are the same as the corresponding components of the first embodiment. Such components will not be described in detail.

Figure 7:
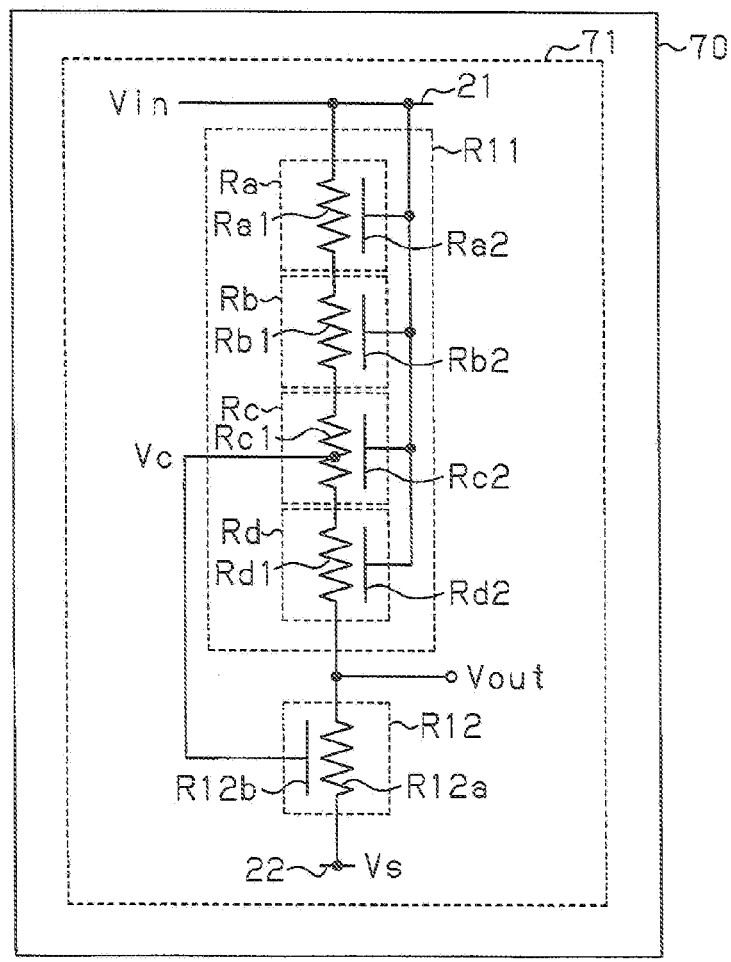
FIG. 7 is a circuit diagram of a voltage divider in a second embodiment.

Referring to FIG. 7, the semiconductor device 70 includes a voltage divider 71. The voltage divider 71 is coupled between a wire 21, which supplies the input voltage Vin, and a wire 22, which supplies the reference voltage (e.g., ground voltage (0 V)) that is lower than the input voltage V1, to generate the output voltage Vout between the input voltage Vin and the reference voltage Vs.

The voltage divider 71 includes two series-connected resistors R11 and R12. The first resistor R11 is coupled between the wire 21, which supplies the input voltage Vin, and an output node N1. The second resistor R12 is coupled between the wire 22, which supplies the reference voltage Vs, and the output node N1.

The first resistor R11 has an electrical resistance set to be greater by an integral multiple (e.g., four times) of the electrical resistance of the second resistor R12. For example, the first resistor R1 includes four resistor units Ra, Rb, Rc, and Rd, each having an electrical resistance equal to that of the second resistor R12. The resistor units Ra to Rd are connected in series between the wire 21, which supplies the input voltage Vin, and the output node N1.

At the output node N1, the voltage divider 71 generates a divisional voltage between the input voltage Vin and the reference voltage Vs in accordance with the ratio (electric resistance ratio) of the electrical resistance of the first resistor R11 and the electrical resistance of the second resistor R12. The voltage divider 71 outputs the voltage at the output node N1 (output voltage Vout).

The first resistor R11 and the second resistor R12 are, for example, diffused resistors. The first resistor unit Ra includes a diffusion region Ra1 and a well region Ra2. In the same manner, the second resistor unit Rb includes a diffusion region Rb1 and a well region Rb2. The third resistor unit Rc includes a diffusion region Rc1 and a well region Rc2. The fourth resistor unit Rd includes a diffusion region Rd1 and a well region Rd2. The second resistor R12 includes a diffusion region R12a and a well region R12b. The diffusion regions Ra1 to Rd1 and R12a have the same electrical resistance.

The well regions Ra2 to Rd2 of the resistor units Ra to Rd in the first resistor R11 are each supplied with the input voltage Vin. The well region of the second resistor R12 is coupled to a voltage dividing node Nd that is set in the first resistor R11. Among the resistor units Ra to Rd and the resistor R12 connected in series between the wire 21, which transmits the input voltage Vin, and the wire 22, which transmits the reference voltage Vs, the voltage dividing node Nd is set at the resistor unit Rc, which is located at the medial position.

As described above, the input voltage Vin is supplied to the well regions Ra2 to Rd2 of the resistor units Ra to Rd. Accordingly, the potentials are the same at the well regions Ra2 to Rd2. Thus, the well regions Ra2 to Rd2 may be formed as a single region. More specifically, referring to FIG. 8, the four resistor units Ra to Rd in the first resistor R11 form a single well region 81. Each of the resistor units Ra to Rd includes a plurality of (six in FIG. 8) resistor elements, or diffusion regions 82. The diffusion regions 82 are connected in series. In the illustrated example, each of the diffusion regions 82 is box-shaped and elongated in a predetermined direction. The well region 81 is formed by doping P-type impurities (e.g., phosphorus (P)) to a semiconductor substrate (silicon). Each diffusion region 82 is formed by doping impurities (e.g., boron (B)) to the well region.

In the same manner, the second resistor R12 includes a well region 83 provided with a plurality of (six in FIG. 8) resistor elements, or diffusion regions 84. The diffusion regions 84 are connected in series. Each diffusion region 84 in the second resistor R12 is formed to have the same electrical resistance as each of the diffusion regions 82 in the first resistor R11.

A wire 85, which connects the diffusion regions 82 in the first resistor R11 and the diffusion region 84 in the second resistor R12, functions as the output node that generates the divisional voltage between the input voltage Vin and the reference voltage Vs.

Two diffusion regions 82a and 82b in the resistor unit Rc, which are located at a medial position between the input voltage Vin and the reference voltage Vs, are coupled to each other by a low resistance wire 86. The wire 86 is coupled at a medial position between the wire 21, which transmits the input voltage Vin, and the wire 22, which transmits the reference voltage Vs. The voltage at the wire 86 is the medial voltage between the input voltage Vin and the reference voltage Vs. Accordingly, the wire 86 functions as the voltage dividing node that generates a medial voltage Vc of the input voltage Vin and the reference voltage Vs. The wire 86 is coupled to the well region 83 of the second resistor R12 by a wire 87.

FIG. 3B illustrates the voltage divider 50b of the comparative example. In the voltage divider 50b, the well region corresponding to each resistor is coupled to a terminal to which a high potential side voltage is applied. Thus, the electrical resistances of the two resistors change in the same manner. Accordingly, referring to FIG. 9, a voltage divider 90 of a comparative example, which includes a plurality of series-connected resistors 91 to 95, generates a divisional voltage Vout between the input voltage Vin and the reference voltage Vs in the same manner as the voltage divider 71 illustrated in FIG. 7. Well regions corresponding to the resistors 91 to 95 of the voltage divider 90 illustrated in FIG. 9 have different voltages. Accordingly, the resistors 91 to 95 are formed separately so that the voltages of the well regions corresponding to the resistors 91 to 95 may be controlled individually, that is, independently. Due to the distance for the separation, the area of the regions in which the resistors 91 to 94 are formed is greater than the area of the well region 81 illustrated in FIG. 8. Accordingly, the area occupied by the voltage divider 71, which is formed as illustrated in FIGS. 7 and 8, is less than the voltage divider 90 of the comparative example illustrated in FIG. 9. In this manner, the voltage divider 71 illustrated in FIG. 7 suppresses increases in the occupied area.

The second embodiment has the advantages described below.

(1) The first resistor R11 includes the series-connected resistor units Ra to Rd. Each of the well regions Ra2 to Rd2 of the resistor units Ra to Rd is supplied with the input voltage Vin. Accordingly, the diffusion regions Ra1 to Rd1 of the resistor units Ra to Rd may be formed in the single well region 81. As a result, in comparison with the voltage divider 90 of the comparative example that forms the well regions of the resistors units 91 to 94 separately from one another, the occupied area of the first resistor R11 becomes small. As a result, an increase in the area of the semiconductor device 70 may be suppressed.

(2) Each of the resistor units Ra to Rd has an electrical resistance that is set to be equal to the electrical resistance of the second resistor R12. The resistor units Ra to Rd and the second resistor R12 include a plurality of (more specifically, an even number of) the series-connected diffusion regions 82 and 84. Accordingly, the position of the voltage dividing node Nd that generates the medial voltage Vc may easily be set or determined. The voltage dividing node Nd may be arranged in a certain wire that connects diffusion regions 82.

Third Embodiment

A third embodiment will now be described with reference to FIGS. 10 to 13. Like or same reference numerals are given to those components that are the same as the corresponding components of the above embodiments. Such components will not be described in detail.

Figure 10:
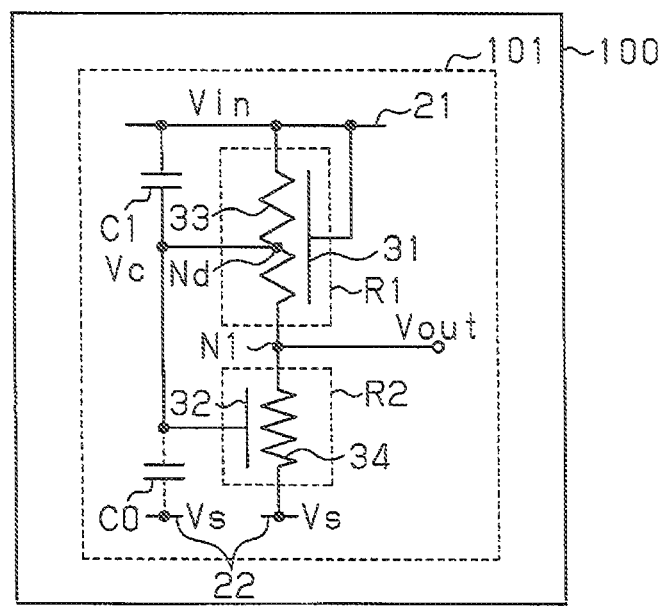
FIG. 10 is a circuit diagram of a voltage divider in a third embodiment.

FIG. 10 illustrates a semiconductor device 100 including a voltage divider 101. The voltage divider 101 includes a first resistor R1, a second resistor R2, and a capacitor C1. The capacitor C1 includes a first terminal and a second terminal. The first terminal of the capacitor C1 is coupled to a wire 21, which transmits the input voltage Vin. The second terminal of the capacitor C2 is coupled to a well region 32 of the second resistor R2 (and a voltage dividing node Nd).

Figure 11:
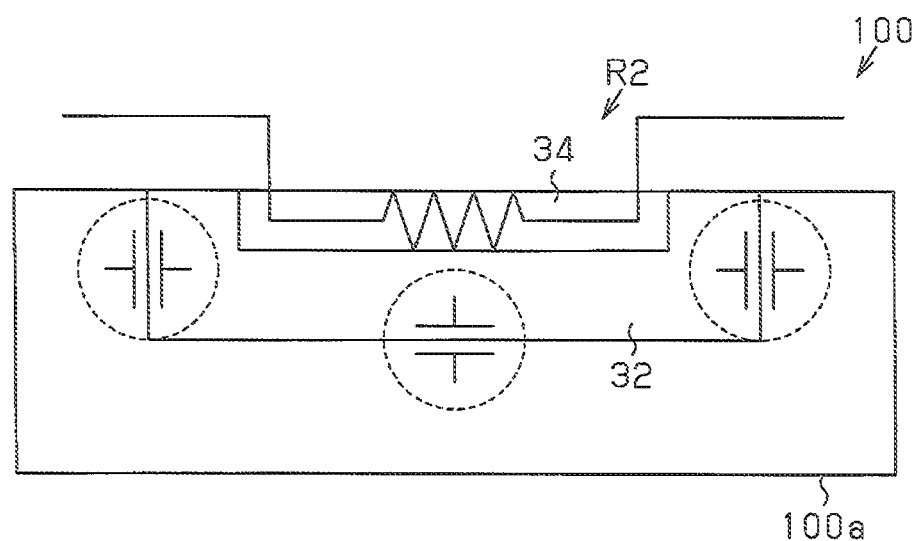
FIG. 11 is a schematic cross-sectional view of a semiconductor device.

Referring to FIG. 11, the second resistor R2 includes an N-type well region 32, which is formed in a P-type semiconductor substrate 100a, and a P-type diffusion region 34, which is formed in the well region 32. A parasitic capacitor (junction capacitor) C0 is formed between the well region 32 and the semiconductor substrate 100a. As illustrated in FIG. 10, the parasitic capacitor C0 is coupled between the well region 32 of the second resistor R2 and a wire 22, which transmits the low potential side reference voltage Vs. The parasitic capacitor C0, the first resistor R1, and the second resistor R2 form a parasitic RC circuit.

Figure 12:
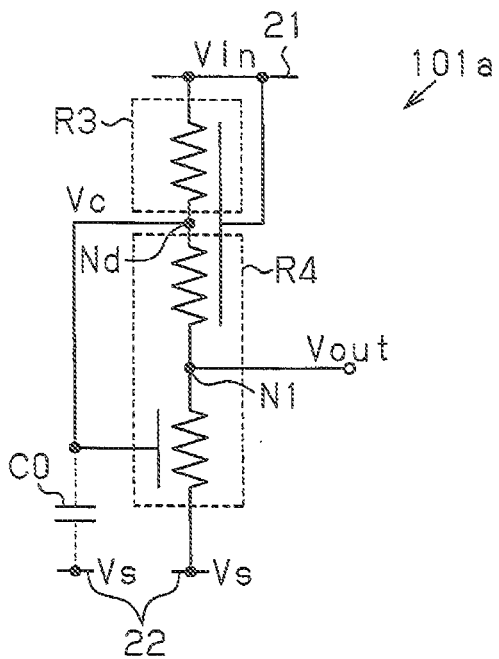
FIG. 12 is a circuit diagram of an equivalent circuit.

With respect to changes in the input voltage Vin, the parasitic RC circuit delays voltage changes at the voltage dividing node Nd. Accordingly, the circuit elements excluding the capacitor C1 in the voltage divider 101 illustrated in FIG. 10 may be expressed as an equivalent circuit, which is illustrated in FIG. 12. The equivalent circuit, or voltage divider 101a, includes resistors R3 and R4 that are connected in series between the wire 21, which transmits the input voltage Vin, and the wire 22, which transmits the reference voltage Vs. The parasitic capacitance C0 is coupled to a node (voltage dividing node Nd) between the resistors R3 and R4. In the voltage divider 101a (equivalent circuit), after the input voltage Vin is supplied, the voltage Vc at the voltage dividing node Nd changes as time elapses in accordance with the following equation.

$$Vout(t) = \left(\frac{R2}{R3+R2}\right)Vin\left[1-\exp\left(-\frac{R3+R2}{C0R3R2}t\right)\right]$$

Figure 13:
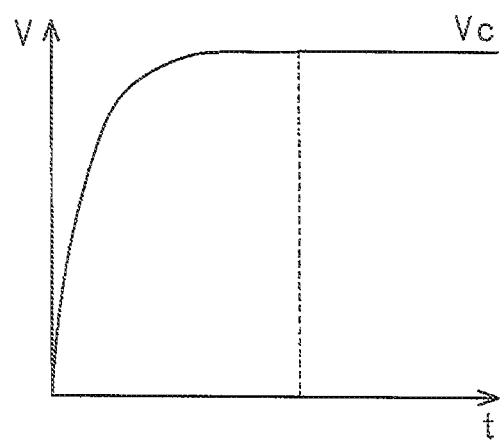
FIG. 13 is a graph illustrating the characteristics of the equivalent circuit of FIG. 12.

FIG. 13 illustrates changes in the voltage Vc at the voltage dividing node Nd.

In the voltage divider 101a (equivalent circuit) illustrated in FIG. 12, for example, when the medial voltage Vc is 21 V, the electrical resistance of the resistors R3 and R4 is 10.5 MΩ, and the capacitance of the parasitic capacitor C0 is $8\times10^{-11}$ F, the medial voltage Vc reaches a predetermined voltage (21 v) with a delay of approximately 3 to 4 mS (milliseconds) from when the input voltage Vin is supplied. For example, the input voltage Vin changes from 0 V to a predetermined voltage within several microseconds (μs), whereas the medial voltage Vc is reached with a delay of several milliseconds (mS).

In contrast, the voltage divider 101 illustrated in FIG. 10 includes the capacitor C1. The capacitor C1 is coupled between the wire 21, which transmits the input voltage Vin, and the wire 22, which transmits the reference voltage Vs. Thus, when the capacitor C1 and the parasitic capacitor C0 are set to have the same capacitance, the potential at a node between the capacitor C1 and the parasitic capacitor C0 becomes the medial voltage between the input voltage Vin and the reference voltage Vs ((Vin+Vs)/2). As a result, the voltage Vc at the voltage dividing node Nd, that is, the voltage (well voltage) applied to the well region 32 of the second changes with a delay of substantially 0 seconds from a change in the input voltage Vin. The connection of the capacitor C1, which has the same capacitance as the parasitic capacitor C0, results in the medial voltage Vc supplied to the well region 32 of the second resistor R2 following the input voltage.

The third embodiment has the advantage described below.

(1) The capacitor C1 includes one end coupled to the well region 32 of the second resistor R2 and another end supplied with the input voltage Vin. The parasitic capacitor C0 is formed between the well region 32 of the second resistor R2 and the semiconductor substrate 100a. The capacitor C1 is set to have the same capacitance as the parasitic capacitor C0. Accordingly, a node between the capacitor C1 and the parasitic capacitor C0 has the medial voltage of the input voltage Vin and the reference voltage Vs. As a result, the medial voltage Vc, which is supplied to the well region 32 of the second resistor R2, may follow the input voltage Vin.

Fourth Embodiment

A fourth embodiment will now be described with reference to FIGS. 14 and 15. Like or same reference numerals are given to those components that are the same as the corresponding components of the above embodiments. Such components will not be described in detail.

Figure 14:
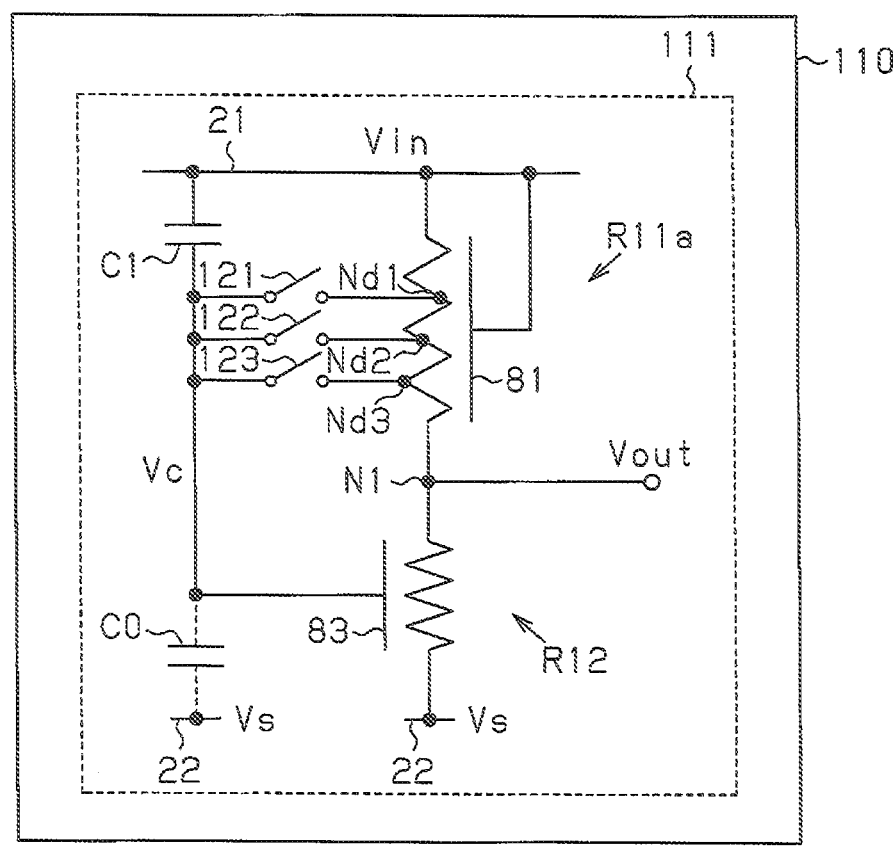
FIG. 14 is a circuit diagram of a voltage divider in a fourth embodiment.

FIG. 14 illustrates a semiconductor device 110 including a voltage divider 111. The voltage divider 111 includes a first resistor R11a, a second resistor R12, a capacitor C1, and a plurality of (three in FIG. 14) switches 121, 122, and 123. A plurality of (three in FIG. 14) of voltage dividing nodes Nd1, Nd2, and Nd3 are set for the first resistor R11a. The voltage dividing nodes Nd1 to Nd3 are coupled to first ends of the switches 121 to 123, respectively. Second terminals of the switches 121 to 123 are commonly coupled to a well region 83 of the second resistor R12. The switches 121 to 123 form one example of a selector.

Figure 15:
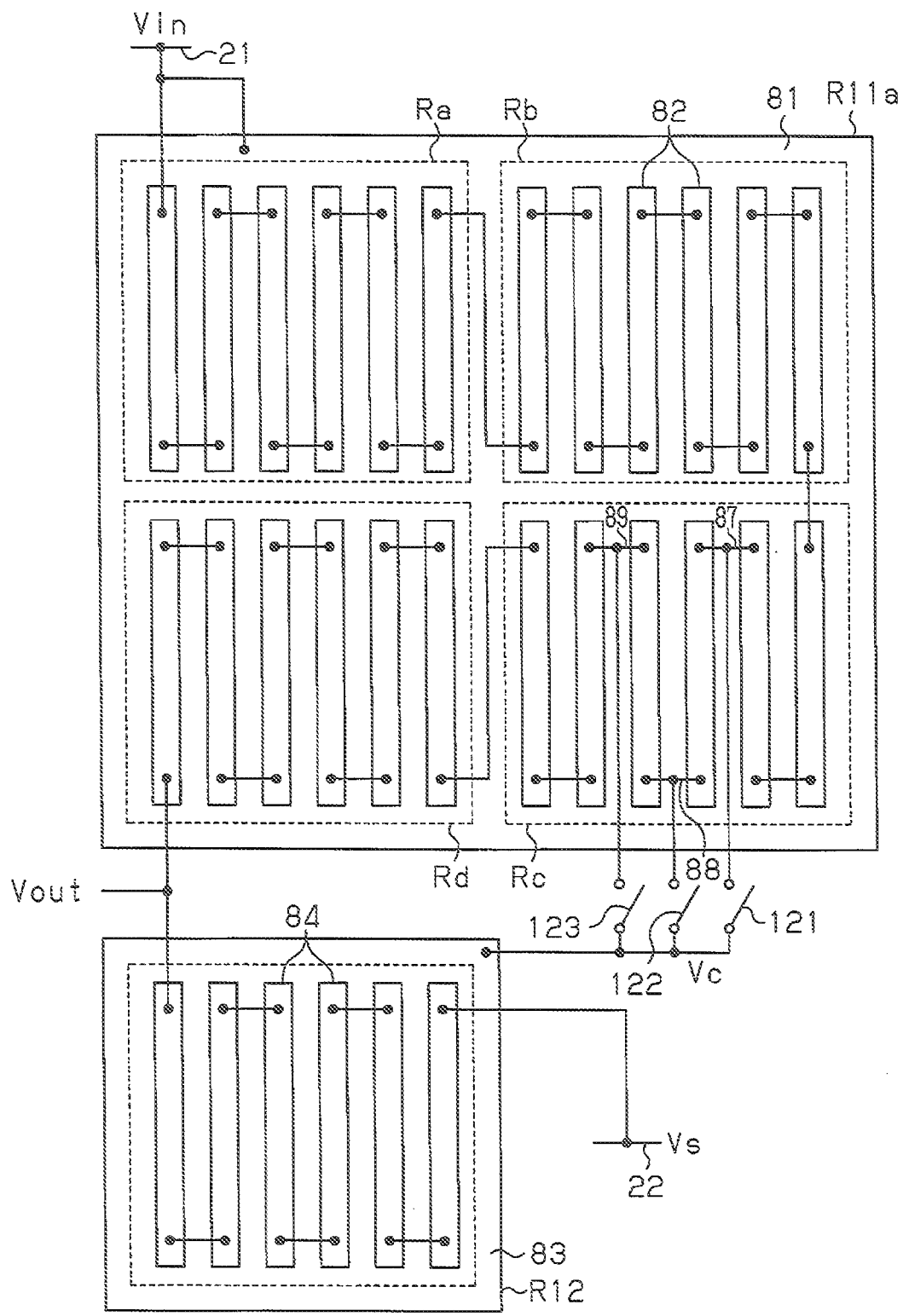
FIG. 15 is a schematic layout diagram of the voltage divider illustrated in FIG. 14.

In the example illustrated in FIG. 15, the first resistor R11a includes four resistor units Ra, Rb, Rc, and Rd. The switches 121, 122, and 123 are respectively coupled to wires 87, 88, and 89, which are coupled to diffusion regions 82 in the resistor unit Rc. Each of the switches 121 to 123 is, for example, a transistor that is activated and deactivated in accordance with the setting of a register. The register is set, for example, by a non-volatile memory or a fuse.

The activation and deactivation of the switches 121 to 123 selects one of the voltage dividing nodes Nd1 to Nd3, and voltage at the selected voltage dividing node is supplied to the well region 83 of the second resistor R12. In this manner, by allowing for selection of one of the voltage dividing nodes Nd1 to nd3, the optimal medial voltage Vc may be supplied to the well region 83 of the second resistor R2.

The fourth embodiment has the advantage described below.

(1) The voltage dividing nodes Nd1 to Nd3 are set for the first resistor R11a. The switches 121 to 123 select one of the voltage dividing nodes Nd1 to Nd3 and connect the second resistor R12 to the well region 32. This supplies the optimal medial voltage Vc to the well region 83 of the second resistor R2.

Fifth Embodiment

A fifth embodiment will now be described with reference to FIG. 16. Like or same reference numerals are given to those components that are the same as the corresponding components of the above embodiments. Such components will not be described in detail.

Figure 16:
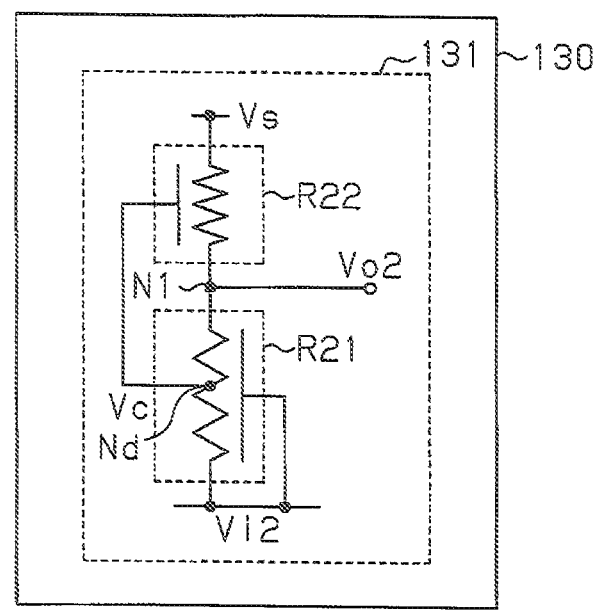
FIG. 16 is a circuit diagram of a voltage divider in a fifth embodiment.

FIG. 16 illustrates a semiconductor device 130 including a voltage divider 131 that generates a voltage V02 by dividing an input voltage V12, which is lower than the reference voltage Vs. The voltage divider 131 includes a first resistor R21, which is supplied with the input voltage V12, and a second resistor R22, which is connected in series to the first resistor R21. The second resistor R22 is supplied with the reference voltage Vs. The voltage divider 131 generates a divisional voltage V02 between the input voltage V12 and the reference voltage Vs from an output node N1 between the first resistor R21 and the second resistor R22 in accordance with the electrical resistance of the first resistor R21 and the electrical resistance of the second resistor R22.

The first resistor R21 and the second resistor R22 are, for example, diffused resistors. The first resistor R21 and the second resistor R22 include N-type diffused regions. That is, P-type well regions are formed in a semiconductor substrate, and N-type diffused regions are formed in the P-type well regions. The well region of the first resistor R21 is supplied with the input voltage V12. The well region of the second resistor R22 is coupled to a voltage dividing node Nd that is set in the first resistor R21.

When a resistor includes a P-type diffused region, it is preferable that a bias voltage greater than or equal to the voltage generated at the diffusion region be supplied to the well region that forms the diffusion region. For example, as illustrated in the comparative examples of FIGS. 3A and 3B, a well region is coupled to the terminal supplied with high potential side voltage. This prevents a PN junction from functioning as a diode. Accordingly, when a resistor includes an N-type diffusion region, it is preferable that a bias voltage less than or equal to the voltage applied to the diffusion region be supplied to the P-type well region that forms the diffusion region.

The terminal voltage of the resistors R21 and R22 are relative voltages. Accordingly, when a divisional voltage that is higher than the medial voltage Vc is obtained from two input voltages, a voltage divider provided with resistors including the N-type diffusion regions may be used.

The fifth embodiment has the advantages described below.

(1) in the resistors R21 and R22 including the N-type diffusion regions, differences in the electrical resistance changing rate of the resistors R21 and R22 may be suppressed by supplying the medial voltage Vc to the well region of the resistor R22.

It should be apparent to those skilled in the art that the present invention may be embodied in many other specific forms without departing from the spirit or scope of the invention. Particularly, it should be understood that the present invention may be embodied in the following forms.

In the same manner as the fifth embodiment, the resistor elements of the second to fourth embodiments may be N-type diffusion regions. In each of the above embodiments, the resistor elements may be the polysilicon film illustrated in FIG. 6.

In each of the above embodiments, a diffused resistor or a semiconductor thin film may be formed in correspondence with a substrate region such as an epitaxial layer.

The capacitor C1 illustrated in the third and fourth embodiments may be applied to other embodiments.

In the second and fourth embodiments, the first resistor R1 includes the series-connected resistor units Ra to Rd, which have the same electrical resistance and the second resistor R2. However, the electrical resistance of each resistor unit may differ from the electrical resistance of the second resistor R2.

In the second and fourth embodiments, the electrical resistance of each diffusion region may be set so that an even number of diffusion regions are connected in series between the wire 21, which transmits the input voltage Vin, and the wire 22, which transmits the reference voltage Vs. This allows for the voltage dividing node Nd to be arranged in a wire coupled to a diffused resistor and facilitates connection. Further, the setting of the voltage dividing node Nd is facilitated.

Figure 17:
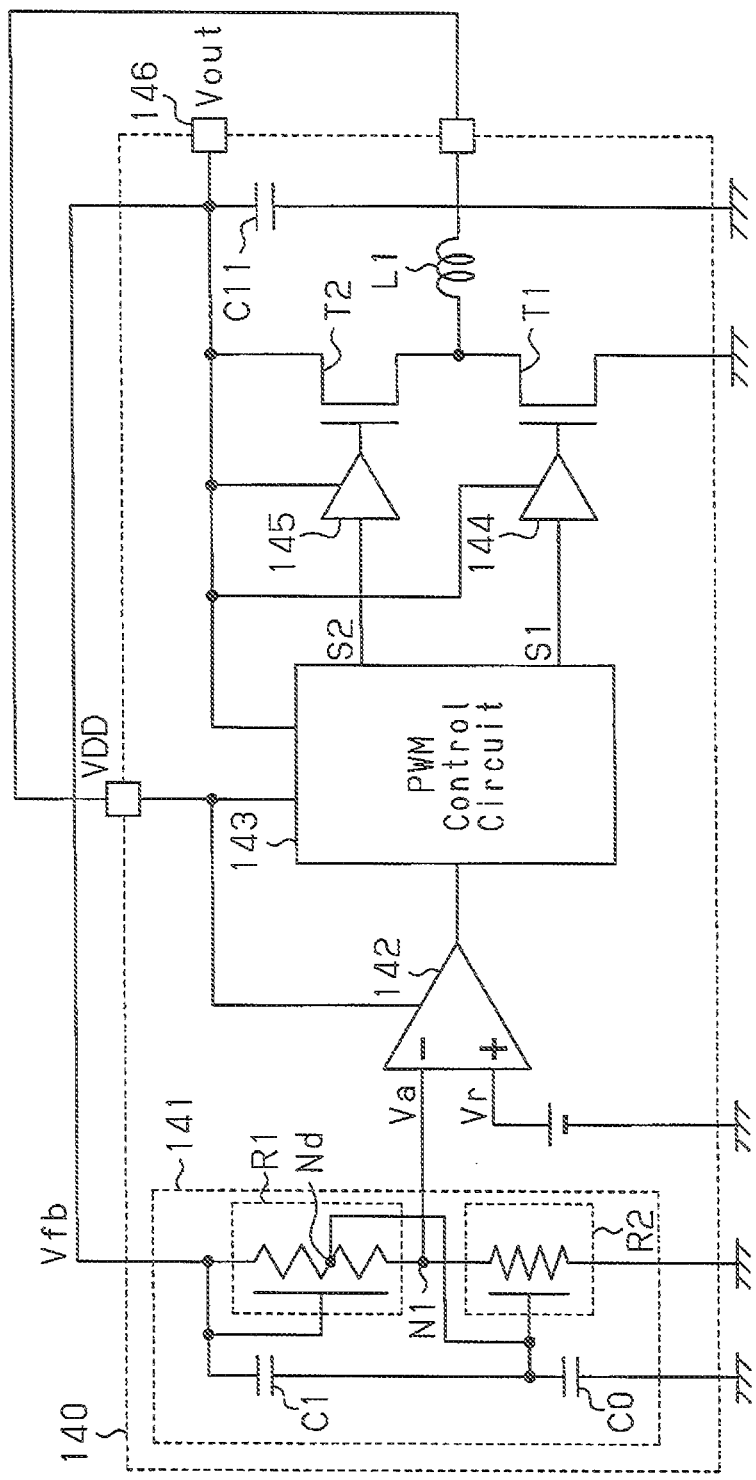
FIG. 17 is a block circuit diagram of a DC-DC converter.

The voltage divider of each embodiment may be used in, for example, a DC-DC converter. As illustrated in FIG. 17, the DC-DC converter 140 includes a voltage divider 141. The voltage divider 141 is, for example, the voltage divider 101 illustrated in FIG. 10.

The voltage Va generated by the voltage divider 141 is supplied to an inverting input terminal of an error amplifier 142. A non-inverting input terminal of the error amplifier is supplied with the reference voltage Vr. The error amplifier 142 outputs an error voltage, which is generated by amplifying the difference between the reference voltage Vr and the voltage Va. A PWM control circuit 143 generates complementary pulse signals S1 and S2, which are in accordance with the error voltage. The driver 144 provides the gate of a transistor T1 with a drive signal that is in accordance with the pulse signal S1. The driver 145 provides the gate of a transistor T2 with a drive signal that is in accordance with the pulse signal S2.

The two transistors T1 and T2 are both, for example, N-channel MOS transistors. The source of the transistor T1 is supplied with the low potential voltage VSS, and the drain of the transistor T1 is coupled to a first terminal of a coil L1. A second terminal of the coil L1 is supplied with a high potential side power supply voltage VDD. A connection point between the transistor T1 and the coil L1 is coupled to the source of the transistor T2, and the drain of the transistor T2 is coupled to an output terminal 146. A capacitor C11 includes a first terminal coupled to the output terminal 146 and a second terminal supplied with a low potential voltage VSS. The voltage at the output terminal 146 (output voltage Vout) is supplied as a feedback voltage Vfb to the voltage divider 141.

The PWM control circuit 143 and the drivers 144 and 145 are supplied with an output voltage Vout. The PWM control circuit 143 and the error amplifier 142 are supplied with the power supply voltage VDD.

The DC-DC converter 140 activates the transistor T1 and deactivates the transistor T2 to store energy in the coil L1. The transistor T1 is deactivated and the transistor T2 is deactivated to release the energy stored in the coil L1. By performing such operations, the DC-DC converter 140 generates an output voltage Vout that is higher than the high potential side power supply voltage VDD. The voltage divider 141 generates a divisional voltage Va that is in accordance with the output voltage Vout. The DC-DC converter 140 controls the activation and deactivation time of the transistors T1 and T2 so that the divided voltage Va becomes equal to the reference voltage Vr.

Accordingly, it is preferable that the resistors R1 and R2 in the voltage divider 141 have equal electrical resistance changing rates. When the changing rates differ, the voltage dividing ratio for generating the divisional voltage Va changes, and the desired output voltage Vout may not be obtained.

The capacitor C1, which is coupled to the well region 32 of the second resistor R2 in the voltage divider 141, stabilizes the output voltage Vout within a short period of time. That is, the capacitor C1 is connected in series to a parasitic capacitor C0 in the second resistor R2 of the voltage divider 141, and the voltage supplied to the well region of the second resistor R2 follows the input voltage (feedback voltage Vfb). Accordingly, the output voltage Vout changes as it follows the input voltage (feedback voltage Vfb).

Figure 18:
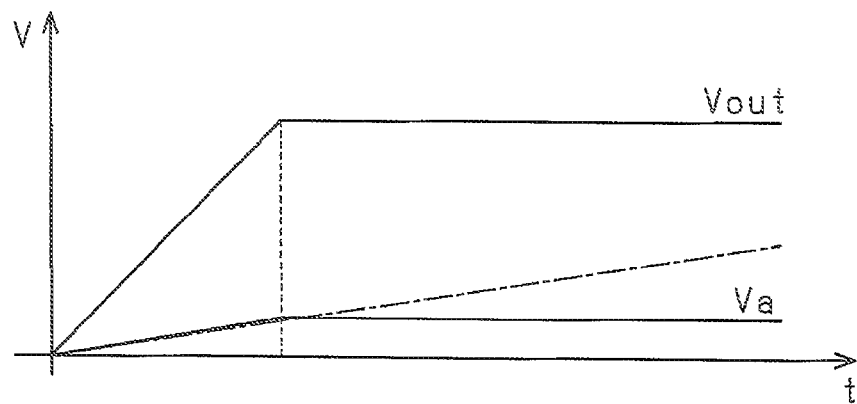
FIG. 18 is a graph illustrating the output characteristics of the DC-DC converter of FIG. 17.

As described in the third embodiment, when the capacitor C1 is not connected, the divisional voltage Va generated by the voltage divider gradually changes in accordance with the electrical resistances of the resistors R1 and R2 and the capacitance of the parasitic capacitor C0 after the supply of the input voltage Vin is started, that is, after the power supply voltage VDD of the DC-DC converter is supplied. Thus, the output voltage Vout also changes in accordance with the divisional voltage Va. Here, as illustrated by the single-dashed line in FIG. 18, the output voltage Vout changes more gradually than when the capacitor C1 is connected. In this manner, due to the voltage divider 141, which includes the capacitor C1, the DC-DC converter 140 may readily and stably generate the output voltage Vout after the supply of the power supply voltage VDD starts.

Figure 19:
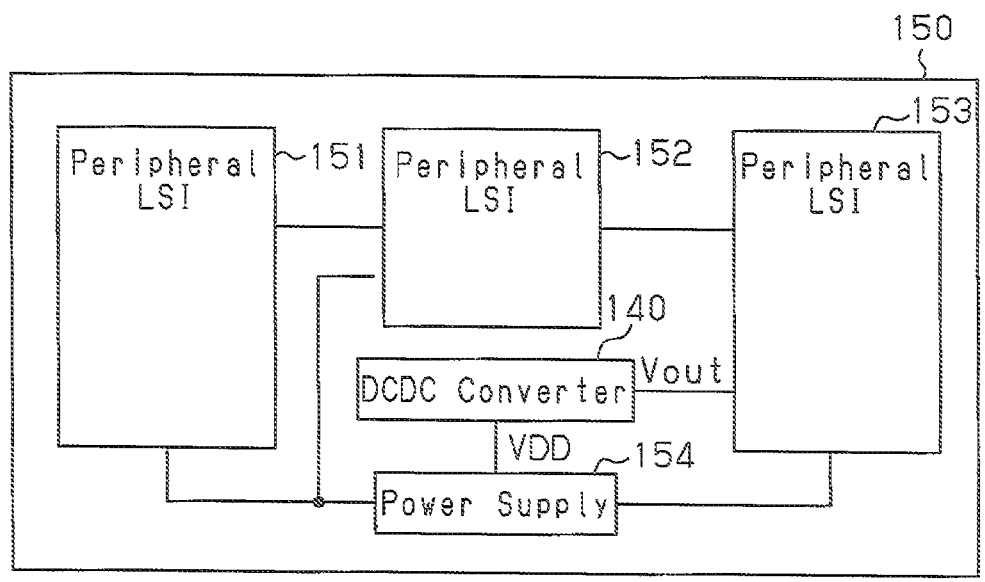
FIG. 19 is a schematic block diagram of a semiconductor device.

The DC-DC converter 140 illustrated in FIG. 17 may be included, for example, in an electronic device 150 illustrated in FIG. 19.

The electronic device 150 includes a plurality of peripheral devices 151, 152, and 153 (peripheral LSIs), a power supply 154, and the DC-DC converter 140. The power supply 154 supplies each of the peripheral devices 151 to 153 with operational voltage based on the voltage supplied from a drive power supply (e.g., rechargeable battery) of the electronic device 150. The power supply 154 supplies operational voltage VDD to the DC-DC converter 140. The DC-DC converter 140 supplies the peripheral device 153 with an output voltage Vout, which is obtained by increasing the operational voltage VDD.

The electronic device 150 is, for example, a digital camera. The peripheral devices 151 to 153 may include an image processor, a memory (e.g., hard disk device (HDD) or non-volatile memory), a display that displays a monitor image, an input/output device such as a touch panel, and the like. It is desirable that a digital camera be able to readily take pictures as soon as it is activated.

The DC-DC converter 140 generates the output voltage Vout, which changes as it follows the power supply voltage VDD. This allows for the activation time (time from when power switch is activated to when pictures may be taken) of each of the peripheral devices 151 to 153 to be shortened.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A semiconductor device comprising:
   a first resistor formed in a first substrate region and coupled between a first node and an output node;
   a second resistor formed in a second substrate region and coupled between a second node and the output node, wherein
      the first substrate region receives a first voltage via the first node,
      the second resistor receives a second voltage via the second node, and
      the second substrate region is connected to the first resistor via a conductive trace;
   a plurality of voltage dividing nodes in the first resistor to generate a plurality of divisional voltages; and
   a selector configured to couple one of the plurality of voltage dividing nodes to the second substrate region.

2. The semiconductor device according to claim 1, wherein the plurality of voltage dividing nodes set so that a first electrical resistance between the first node and the output node is substantially equal to a second electrical resistance between the second node and the output node.

3. The semiconductor device according to claim 1, wherein
   the first resistor comprises a plurality of resistor elements coupled in series, and
   the plurality of voltage dividing nodes is located between the plurality of resistor elements.

4. The semiconductor device according to claim 1, further comprising:
   a capacitor coupled between the first node and the second substrate region.

5. The semiconductor device according to claim 4, wherein the capacitor has a first capacitance substantially equal to a second capacitance of a parasitic capacitor in the second substrate region.

6. The semiconductor device according to claim 1, wherein the first and second resistors are diffusion regions formed in the first and second substrate regions, respectively.

7. The semiconductor device according to claim 1, wherein the first and second resistors are semiconductor thin films formed through an insulation film in the first and second substrate regions, respectively.

8. The semiconductor device according to claim 1, wherein the first and the second resistors comprise an N-type well region and a P-type diffusion region, respectively.

9. The semiconductor device according to claim 1, wherein the output node comprises another conductive trace with a first node and a second node and the conductive trace comprises a third node and a fourth node, and wherein
   the first node is connected to the first resistor,
   the second node is connected to the second resistor,
   the third node is connected to the first resistor, and
   the fourth node is connected to the second substrate.

10. The semiconductor device according to claim 1, wherein the voltage at one of the plurality of voltage dividing nodes is substantially equal to an average voltage of the first node and the second node.

11. A voltage divider comprising:
    a first resistor formed in a first substrate region and coupled between a first node and an output node;
    a second resistor formed in a second substrate region and coupled between a second node and the output node, wherein
       the first substrate region receives a first voltage via the first node,
       the second resistor receives a second voltage via the second node, and
       the second substrate region is connected to the first resistor via a conductive trace;
    a plurality of voltage dividing nodes in the first resistor to generate a plurality of divisional voltages;
    a selector configured to couple one of the plurality of voltage dividing nodes to the second substrate region; and
    a capacitor with a first terminal coupled to the first node and a second terminal coupled to the first resistor and the second substrate region.

12. The voltage divider according to claim 11, wherein the plurality of voltage dividing nodes is set so that a first electrical resistance between the first node and the output node is substantially equal to a second electrical resistance between the second node and the output node.

13. The voltage divider according to claim 11, wherein
    the first resistor comprises a plurality of resistor elements coupled in series, and
    the plurality of voltage dividing nodes is located between the plurality of resistor elements.

14. The voltage divider according to claim 11, wherein the capacitor has a first capacitance substantially equal to a second capacitance of a parasitic capacitor in the second substrate region.

15. The voltage divider according to claim 11, wherein the first and the second resistors are diffusion regions formed in the first and the second substrate regions, respectively.

16. The voltage divider according to claim 11, wherein the first and the second resistors are semiconductor thin films formed through an insulation film in the first and the second substrate regions, respectively.

17. The voltage divider according to claim 11, wherein the first and the second resistors comprise an N-type well region and a P-type diffusion region, respectively.

18. The voltage divider according to claim 11, wherein the output node comprises another conductive trace with a first node and a second node and the conductive trace comprises a third node and a fourth node, and wherein
    the first node is connected to the first resistor,
    the second node is connected to the second resistor,
    the third node is connected to the first resistor, and
    the fourth node is connected to the second substrate.

* * * * *

UNITED STATES PATENT AND TRADEMARK OFFICE
CERTIFICATE OF CORRECTION

PATENT NO. : 8,928,397 B2
APPLICATION NO. : 13/564357
DATED : January 6, 2015
INVENTOR(S) : Kodera et al.

Page 1 of 1

It is certified that error appears in the above-identified patent and that said Letters Patent is hereby corrected as shown below:

On the title page, Item (56), References Cited under Foreign Patent Documents line 1:

"JP 6-162825 A" should read --JP 6-163825 A--.

Signed and Sealed this
Second Day of June, 2015

Michelle K. Lee
*Director of the United States Patent and Trademark Office*